(12) United States Patent
Tsuji

(10) Patent No.: US 12,464,783 B2
(45) Date of Patent: Nov. 4, 2025

(54) INSULATED GATE SEMICONDUCTOR DEVICE

(71) Applicant: FUJI ELECTRIC CO., LTD., Kawasaki (JP)

(72) Inventor: Takashi Tsuji, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 449 days.

(21) Appl. No.: 17/589,200

(22) Filed: Jan. 31, 2022

(65) Prior Publication Data

US 2022/0285483 A1 Sep. 8, 2022

(30) Foreign Application Priority Data

Mar. 8, 2021 (JP) ................... 2021-36457

(51) Int. Cl.

| | |
|---|---|
| *H10D 62/10* | (2025.01) |
| *H01L 21/76* | (2006.01) |
| *H01L 21/761* | (2006.01) |
| *H10D 12/01* | (2025.01) |
| *H10D 30/66* | (2025.01) |
| *H10D 62/17* | (2025.01) |
| *H10D 62/832* | (2025.01) |

(52) U.S. Cl.
CPC ....... *H10D 62/109* (2025.01); *H01L 21/7602* (2013.01); *H01L 21/761* (2013.01); *H10D 12/031* (2025.01); *H10D 30/668* (2025.01); *H10D 62/108* (2025.01); *H10D 62/393* (2025.01); *H10D 62/8325* (2025.01)

(58) Field of Classification Search
CPC ............ H01L 29/7813; H01L 29/0626; H01L 29/063; H01L 29/0623
See application file for complete search history.

(56) References Cited

U.S. PATENT DOCUMENTS

| | | |
|---|---|---|
| 9,954,054 B2 | 4/2018 | Shiomi |
| 9,997,358 B2 | 6/2018 | Wakimoto et al. |
| 10,002,952 B2 | 6/2018 | Sugahara |
| 10,199,493 B2 | 2/2019 | Kinoshita |
| 10,367,092 B2 | 7/2019 | Wakimoto et al. |
| 10,403,749 B2 | 9/2019 | Kinoshita |

(Continued)

FOREIGN PATENT DOCUMENTS

| | | |
|---|---|---|
| JP | 6617657 B2 | 11/2019 |
| WO | 2016002766 A1 | 1/2016 |
| WO | 2017064949 A1 | 4/2017 |

*Primary Examiner* — Chad M Dicke
*Assistant Examiner* — Jeremy Daniel Watts

(57) ABSTRACT

A semiconductor device includes: a high-concentration layer of a first conductivity-type provided on a drift layer of the first conductivity-type; a buried layer of a second conductivity-type provided in the high-concentration layer; an injection regulation region of the second conductivity-type provided on the high-concentration layer; a high-concentration region of the second conductivity-type provided inside the injection regulation region; a carrier supply region of the first conductivity-type provided at an upper part of the injection regulation region; and an insulated gate structure provided inside a trench, wherein a ratio of the impurity concentration of the injection regulation region to an impurity concentration of an upper part of the high-concentration layer is 0.5 or greater and 2 or smaller.

15 Claims, 17 Drawing Sheets

(56) References Cited

U.S. PATENT DOCUMENTS

| | | | |
|---|---|---|---|
| 10,586,703 B2 | 3/2020 | Wakimoto et al. | |
| 10,832,914 B2 | 11/2020 | Wakimoto et al. | |
| 2011/0233606 A1* | 9/2011 | Hsieh | H10D 84/148 |
| | | | 257/334 |
| 2014/0048872 A1* | 2/2014 | Hsieh | H10D 30/0297 |
| | | | 438/270 |
| 2016/0247910 A1* | 8/2016 | Suzuki | H10D 62/157 |
| 2016/0260829 A1* | 9/2016 | Aichinger | H10D 30/668 |
| 2017/0141186 A1 | 5/2017 | Shiomi | |
| 2018/0033876 A1 | 2/2018 | Sugahara | |
| 2018/0197983 A1 | 7/2018 | Kinoshita | |
| 2018/0366549 A1* | 12/2018 | Kojima | H10D 62/157 |
| 2019/0165166 A1 | 5/2019 | Kinoshita | |
| 2019/0181261 A1* | 6/2019 | Okumura | H10D 62/105 |
| 2020/0220008 A1* | 7/2020 | Takeuchi | H10D 62/8325 |
| 2020/0235201 A1* | 7/2020 | Narita | H10D 62/8325 |
| 2020/0403066 A1* | 12/2020 | Narita | H10D 62/107 |
| 2022/0157988 A1* | 5/2022 | Lee | H10D 62/107 |
| 2022/0246719 A1* | 8/2022 | Miyahara | H10D 62/393 |

* cited by examiner

INSULATED GATE SEMICONDUCTOR DEVICE

CROSS-REFERENCE TO RELATED APPLICATION

This application claims benefit of priority under 35 USC 119 based on Japanese Patent Application No. 2021-036457 filed on Mar. 8, 2021, the entire contents of which are incorporated by reference herein.

BACKGROUND

1. Field of the Invention

The present invention relates to a trench-gate insulated-gate semiconductor device.

2. Description of the Related Art

A trench-gate MOS field-effect transistor (MOSFET) can expect an effect of reducing ON resistance in association with a decrease in cell pitch with respect to a planar-gate transistor. In the trench-gate MOSFET using a wide bandgap semiconductor as a material such as silicon carbide (SiC), however, a high voltage tends to be applied to a gate insulating film located at a bottom of a trench, which may cause damage to the gate insulating film.

To relax an electric field intensity at the bottom of the trench, a structure has been proposed in which a p-type buried region is provided at the bottom of the trench, and the p-type buried region is also provided in the middle of the adjacent trench (refer to WO 2016/002766 A1, WO 2017/064949 A1, and JP 6617657 B2).

The semiconductor device disclosed in WO 2016/002766 A1, WO 2017/064949 A1, and JP 6617657 B2 causes an increase in saturation current if the ON resistance is reduced, and decreases a short-circuit safe operating area (SCSOA) upon short-circuit current interruption, leading to a decrease in short-circuit fault tolerance. Namely, the reduction in the ON resistance and the improvement in the short-circuit fault tolerance have a trade-off relationship, and it is thus difficult to achieve both the prevention of the increase in the ON resistance and the improvement in the short-circuit fault tolerance.

SUMMARY

In view of the foregoing problems, the present invention provides a trench-gate insulated-gate semiconductor device capable of achieving an improvement in short-circuit fault tolerance while avoiding an increase in ON resistance.

An aspect of the present invention inheres in an insulated-gate semiconductor device including: a drift layer of a first conductivity-type; a high-concentration layer of the first conductivity-type provided on a top surface of the drift layer; a buried layer of a second conductivity-type provided inside the high-concentration layer; an injection regulation region of the second conductivity-type provided on top surfaces of the high-concentration layer and the buried layer; a high-concentration region of the second conductivity-type provided inside the injection regulation region and having an impurity concentration higher than an impurity concentration of the injection regulation region; a carrier supply region of the first conductivity-type selectively provided at an upper part of the injection regulation region; a trench penetrating the injection regulation region to reach the high-concentration layer; and an insulated gate structure provided inside the trench, wherein a ratio of the impurity concentration of the injection regulation region to the impurity concentration of the high-concentration layer at least at a part in contact with the injection regulation region is 0.5 or greater and 2 or smaller.

DETAILED DESCRIPTION

Figure 1:
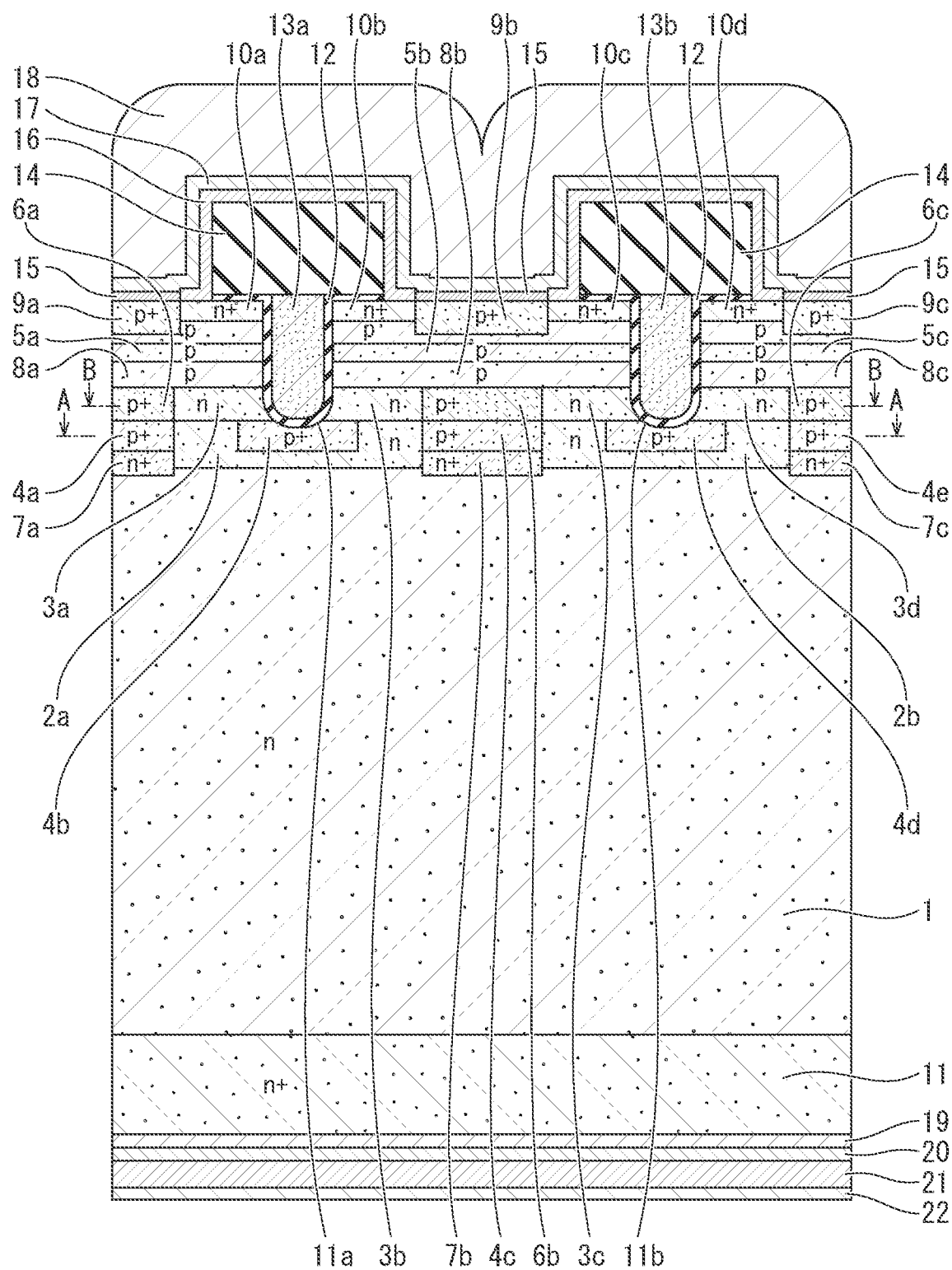
FIG. 1 is a cross-sectional view illustrating a main part of an insulated gate semiconductor device according to an embodiment of the present invention.

With reference to the Drawings, an embodiment of the present invention will be described below. In the Drawings, the same or similar elements are indicated by the same or similar reference numerals. The Drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions. The embodiment described below merely illustrate schematically devices and methods for specifying and giving shapes to the technical idea of the present invention, and the span of the technical idea is not limited to materials, shapes, structures, and relative positions of elements described herein.

In the Specification, a "carrier supply region" means a semiconductor region which supplies majority carriers as a main current. The carrier supply region is assigned to a semiconductor region which will be a source region in a MIS field-effect transistor (MISFET) or a MIS static induction transistor (MISSIT), an emitter region in an insulated-gate bipolar transistor (IGBT), and an anode region in a MIS controlled static induction thyristor (MIS controlled SI thyristor).

A "carrier reception region" means a semiconductor region which receive the majority carriers as the main current. The carrier reception region is assigned to a semiconductor region which will be the drain region in the MISFET or the MISSIT, the collector region in the IGBT, and the cathode region in the MIS controlled SI thyristor. In a semiconductor device having a bipolar type operation such as the IGBT or the MIS controlled SI thyristor, carriers of a conductivity-type opposite to the majority carries are injected from the carrier reception region.

Further, definitions of directions such as an up-and-down direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction.

Further, in the following description, there is exemplified a case where a first conductivity-type is an n-type and a second conductivity-type is a p-type. However, the relationship of the conductivity-types may be inverted to set the first conductivity-type to the p-type and the second conductivity-type to the n-type. Further, a semiconductor region denoted by the symbol "n" or "p" attached with "+" indicates that such semiconductor region has a relatively high impurity concentration as compared to a semiconductor region denoted by the symbol "n" or "p" without "+". A semiconductor region denoted by the symbol "n" or "p" attached with "−" indicates that such semiconductor region has a relatively low impurity concentration as compared to a semiconductor region denoted by the symbol "n" or "p" without "−". However, even when the semiconductor regions are denoted by the same reference symbols "n" and "n", it is not indicated that the semiconductor regions have exactly the same impurity concentration.

Embodiment

<Configuration of Insulated Gate Semiconductor Device>

An insulated gate semiconductor device according to an embodiment of the present invention is illustrated below with a MISFET, as illustrated in FIG. 1. While FIG. 1 illustrates two trench MOS structures (unit cells), the insulated gate semiconductor device according to the embodiment of the present invention has a configuration in which the structures illustrated in FIG. 1 are repeatedly arranged to have a multi-channel structure so as to implement a power semiconductor device (a power device) through which a large amount of current flows.

The insulated gate semiconductor device according to the embodiment of the present invention includes a carrier transport layer (1, 2a, 2b, and 3a to 3d) of a first conductivity-type (n-type), and injection regulation regions (base regions) 8a to 8c of a second conductivity-type (p-type) provided on the carrier transport layer (1, 2a, 2b, and 3a to 3d), as illustrated in FIG. 1.

The carrier transport layer (1, 2a, 2b, and 3a to 3d) is made of a semiconductor (a wide band-gap semiconductor) material having a wider band gap than silicon such as silicon carbide (SiC). The carrier transport layer (1, 2a, 2b, and 3a to 3d) includes a drift layer 1 of n-type, and a high-concentration layer (2a, 2b, and 3a to 3d) of n-type provided on the top surface of the drift layer 1.

The drift layer 1 is a region in which majority carriers of main current flow in a drift electric field. The drift layer 1 is an epitaxially-grown layer of SiC, for example. An impurity concentration of the drift layer 1 is about $1 \times 10^{15}$ cm$^{-3}$ or greater and $3 \times 10^{16}$ cm$^{-3}$ or less, for example.

The high-concentration layer (2a, 2b, and 3a to 3d) is a region in which majority carriers injected from the base regions 8a to 8c move by a drift electric field. The high-concentration layer (2a, 2b, and 3a to 3d) includes lower regions 2a and 2b of n-type, and upper regions 3a to 3d of n-type provided on the top surfaces of the lower high-concentration layers 2a and 2b.

The lower regions 2a and 2b are ion implantation layers (diffusion layers) to which n-type impurity ions such as nitrogen (N) are implanted, for example. The lower regions 2a and 2b may be epitaxially-grown layers of SiC. The lower regions 2a and 2b have a higher impurity concentration than the drift layer 1. The impurity concentration of the respective lower regions 2a and 2b is about $7 \times 10^{16}$ cm$^{-3}$ or greater and $1.5 \times 10^{17}$ cm$^{-3}$ or less, and is preferably about $8 \times 10^{16}$ cm$^{-3}$ or greater and $1.2 \times 10^{17}$ cm$^{-3}$ or less, for example. A thickness of the lower regions 2a and 2b is in a range of about 0.3 μm to 0.5 μm, for example.

The upper regions 3a to 3d are epitaxially-grown layers of SiC, for example. The upper regions 3a to 3d have a higher impurity concentration than the drift layer 1, and have a lower impurity concentration than the lower regions 2a and 2b. The impurity concentration of the respective upper regions 3a to 3d is about $4 \times 10^{16}$ cm$^{-3}$ or greater and $6 \times 10^{16}$ cm$^{-3}$ or less. The impurity concentration of the upper regions 3a to 3d is preferably about $4 \times 10^{16}$ cm$^{-3}$ or greater and $5 \times 10^{16}$ cm$^{-3}$ or less, or is preferably about $5 \times 10^{16}$ cm$^{-3}$ or greater and $6 \times 10^{16}$ cm$^{-3}$ or less.

A thickness of the upper regions 3a to 3d is in a range of about 0.3 μm to 0.5 μm, for example. The thickness of the upper regions 3a to 3d may be the same as that of the lower regions 2a and 2b, may be less than that of the lower regions 2a and 2b, or may be greater than that of the lower regions 2a and 2b.

The high-concentration layer (2a, 2b, and 3a to 3d) is provided inside with a buried layer (4a to 4e and 6a to 6c) of p$^+$-type. The buried layer (4a to 4e and 6a to 6c) includes lower buried regions 4a to 4e of p$^+$-type, and upper buried regions 6a to 6c of p$^+$-type provided on the top surface side of the p$^+$-type lower buried regions 4a to 4e.

The lower buried regions 4a to 4e are selectively provided at upper parts of the lower regions 2a and 2b. The top surfaces of the lower buried regions 4b and 4d are in contact with bottom surfaces of trenches 11a and 11b. The lower buried regions 4a, 4c, and 4e are separated from each other so as to interpose the respective upper parts of the lower regions 2a and 2b in the middle position of the adjacent trenches 11a and 11b. The respective upper parts of the lower regions 2a and 2b interposed between the respective lower buried regions 4a to 4e and the upper regions 3a to 3d implement junction field-effect transistor (JFET) regions. The respective lower parts of the lower regions 2a and 2b, which are deeper than the bottom surfaces of the lower buried regions 4a to 4e, implement current spreading layers (CSLs). The lower buried regions 4b and 4d have a function of relaxing an electric field applied to the gate insulating film 12 located at the bottom surfaces of the trenches 11a and 11b so as to protect the gate insulating film 12. An impurity concentration of the respective lower buried regions 4a to 4e is about 5×10$^{17}$ cm$^{-3}$ or greater and 2×10$^{19}$ cm$^{-3}$ or less, for example. A thickness of the lower buried regions 4a to 4e is in a range of about 0.3 µm to 0.5 µm, for example.

Partial current spreading layers (partial CSLs) 7a to 7c of n$^+$-type are provided in contact with the bottom surfaces of the lower buried regions 4a, 4c, and 4e. The partial current spreading layers 7a to 7c have a function of leading the electric field to be concentrated on the lower buried regions 4a, 4c, and 4e when exceeding a breakdown electric field when an inversion bias is applied so as to easily cause an avalanche breakdown to protect the gate insulating film 12. The present embodiment does not necessarily include the partial current spreading layers 7a to 7c.

The upper buried regions 6a to 6c are selectively provided inside the upper regions 3a to 3d so as to be in contact with the top surfaces of the lower buried regions 4a, 4c, and 4e. The respective side surfaces of the upper buried regions 6a to 6c on both sides are separated from the trenches 11a and 11b but are in contact with the upper regions 3a to 3d.

An impurity concentration of the respective upper buried regions 6a to 6c is about 5×10$^{17}$ cm$^{-3}$ or greater and 2×10$^{19}$ cm$^{-3}$ or less. The impurity concentration of the upper buried regions 6a to 6c may be either equal to or different from the impurity concentration of the lower buried regions 4a to 4e. A thickness of the upper buried regions 6a to 6c is in a range of about 0.3 µm to 0.5 µm, for example. While FIG. 1 illustrates the case in which the upper buried regions 6a to 6c have the same width as the lower buried regions 4a to 4e, the width of the upper buried regions 6a to 6c may be different from the width of the lower buried regions 4a to 4e.

The base regions 8a to 8c are provided on the top surfaces of the upper regions 3a to 3d and the upper buried regions 6a to 6c. The bottom surfaces of the base regions 8a to 8c are thus in contact with the top surfaces of the upper regions 3a to 3d and the upper buried regions 6a to 6c. The base regions 8a to 8c regulate the amount of the majority carriers as a main current injected to the upper regions 3a to 3d. The base regions 8a to 8c are epitaxially-grown layers of SiC, for example. The base regions 8a to 8c have a lower impurity concentration than the lower buried regions 4a to 4e and the upper buried regions 6a to 6c. The impurity concentration of the respective base regions 8a to 8c is about 2×10$^{16}$ cm$^{-3}$ or greater and 1.2×10$^{17}$ cm$^{-3}$ or less, for example. A peak concentration of the impurities of the base regions 8a to 8c is about 2×10$^{16}$ cm$^{-3}$ or greater and 5×10$^{16}$ cm$^{-3}$ or less, and is about 6×10$^{16}$ cm$^{-3}$ or greater and 1.2×10$^{17}$ cm$^{-3}$ or less, for example.

The base regions 8a to 8c are provided with high-concentration regions 5a to 5c of p-type evenly in the middle in the depth direction. The high-concentration regions 5a to 5c are the p-type regions formed such that p-type impurity ions are implanted to the base regions 8a to 8c and having a higher impurity concentration than the base regions 8a to 8c. The high-concentration regions 5a to 5c are not in contact with the upper regions 3a to 3d, or base contact regions 9a to 9c or source regions 10a to 10d described below. An impurity concentration of the respective high-concentration regions 5a to 5c is about 2×10$^{17}$ cm$^{-3}$ or greater and 7×10$^{17}$ cm$^{-3}$ or less, for example. The impurity concentration of the respective high-concentration regions 5a to 5c is also about 3×10$^{17}$ cm$^{-3}$ or greater and 5×10$^{17}$ cm$^{-3}$ or less, for example.

The respective impurity concentrations of the base regions 8a to 8c and the upper regions 3a to 3d are set so that a ratio of the impurity concentration of the base regions 8a to 8c to the impurity concentration of the upper regions 3a to 3d is about 0.5 or greater and 2 or smaller, for example. The respective impurity concentrations of the base regions 8a to 8c and the upper regions 3a to 3d are preferably set so that the ratio of the impurity concentration of the base regions 8a to 8c to the impurity concentration of the upper regions 3a to 3d is about 0.5 or greater and 1 or smaller, or about 1.2 or greater and 2 or smaller, for example.

The carrier supply regions (source regions) 10a to 10d of n$^+$-type are selectively provided at the upper parts of the base regions 8a to 8c. The source regions 10a to 10d have a higher impurity concentration than the drift layer 1. The impurity concentration of the respective source regions 10a to 10d is about 1×10$^{18}$ cm$^{-3}$ or greater and 1×10$^{21}$ cm$^{-3}$ or less, for example.

The base contact regions 9a to 9c of p$^+$-type are selectively provided at the upper parts of the base regions 8a to 8c. The respective side surfaces of the base contact regions 9a to 9c on both sides are in contact with the source regions 10a to 10d. The base contact regions 9a to 9c have a higher impurity concentration than the base regions 8a to 8c. The impurity concentration of the respective base contact regions 9a to 9c is about 1×10$^{20}$ cm$^{-3}$ or greater and 5×10$^{20}$ cm$^{-3}$ or less, for example.

The trenches 11a and 11b are provided to penetrate the source regions 10a to 10d, the base regions 8a to 8c, the high-concentration regions 5a to 5c, and the upper regions 3a to 3d so as to reach the top surfaces of the lower buried regions 4b and 4d. The respective side surfaces of the trenches 11a and 11b are in contact with the source regions 10a to 10d, the base regions 8a to 8c, the high-concentration regions 5a to 5c, and the upper regions 3a to 3d. The bottom surfaces of the trenches 11a and 11b are in contact with the top surfaces of the lower buried regions 4b and 4d.

The bottom surfaces of the trenches 11a and 11b may be located at the same depth as the top surfaces of the lower buried regions 4b and 4d, or may be located inside the lower buried regions 4b and 4d. The trenches 11a and 11b have a depth of about 1 µm or greater and 2 µm or less, a width of about 0.3 µm or greater and 1 µm or less, and a gap of about 1 µm or greater and 5 µm or less, for example.

The insulated gate semiconductor device according to the embodiment of the present invention includes insulated gate structures (12 and 13a) and (12 and 13b) provided inside the respective trenches 11a and 11b. The insulated gate structures (12 and 13a) and (12 and 13b) regulate a surface potential of the base regions 8a to 8c located in contact with the side walls of the trenches 11a and 11b. The insulated gate structures (12 and 13a) and (12 and 13b) include the gate insulating film 12 deposited on the bottom surfaces and the side surfaces of the trenches 11a and 11b, and gate electrodes 13a and 13b provided inside the trenches 11a and 11b via the gate insulating film 12.

The gate insulating film 12 as used herein can be a silicon oxide film (a $SiO_2$ film), for example, and other examples other than the $SiO_2$ film include a silicon oxynitride (SiON) film, a strontium oxide (SrO) film, a silicon nitride ($Si_3N_4$) film, an aluminum oxide ($Al_2O_3$) film, a magnesium oxide (MgO) film, an yttrium oxide ($Y_2O_3$) film, a hafnium oxide ($HfO_2$) film, a zirconium oxide ($ZrO_2$) film, a tantalum oxide ($Ta_2O_5$) film, a bismuth oxide ($Bi_2O_3$) film, and aluminum lanthanum oxide ($LaAlO_3$) film. Further, two or more of these layers listed above may be chosen and stacked on one another so as to be used as a composite film.

A material used for the gate electrodes 13a and 13b may be a polysilicon layer (a doped polysilicon layer) with which p-type impurity ions such as boron (B) or n-type impurity ions such as phosphorus (P) are heavily doped, or a refractory metal, for example. While FIG. 1 illustrates the case in which the top surfaces of the gate electrodes 13a and 13b are at the same level as the top surfaces of the source regions 10a and 10d, the present embodiment is not limited to this case. For example, the upper parts of the gate electrodes 13a and 13b may extend over the top surfaces of the source regions 10a to 10d via the gate insulating film 12

Figure 2:
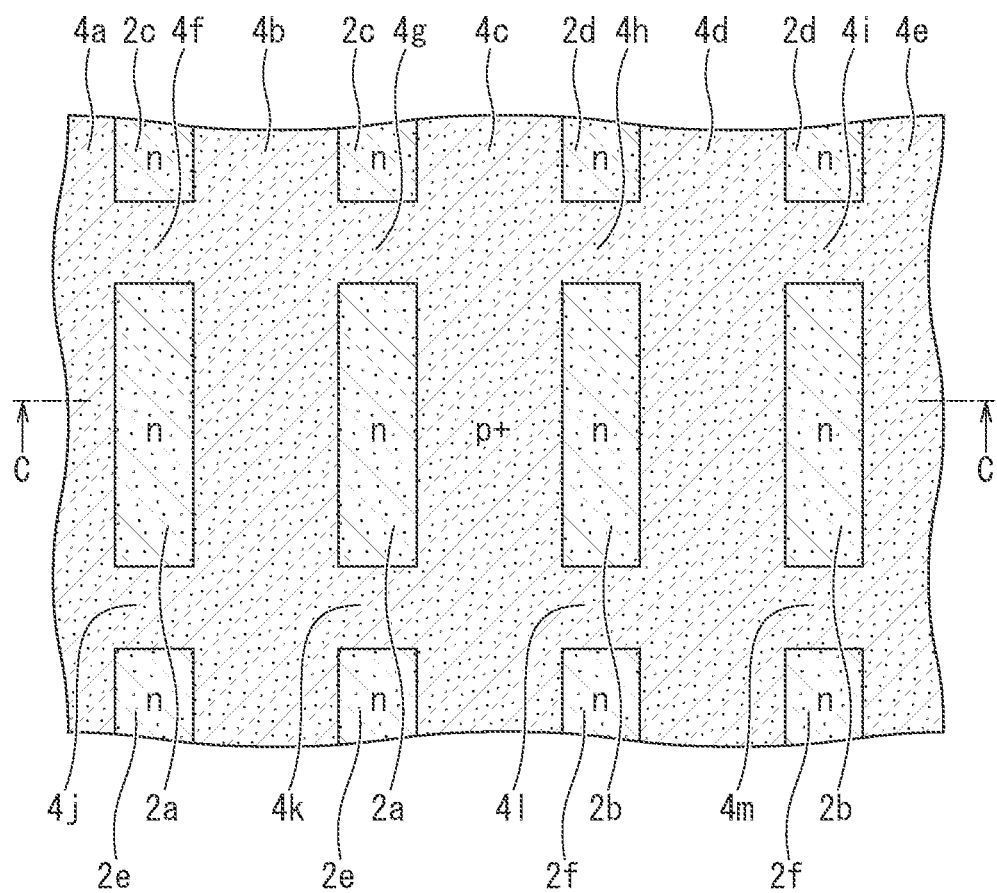
FIG. 2 is a horizontal cross-sectional view as viewed from direction A-A in FIG. 1.

FIG. 2 corresponds to a horizontal cross-sectional view (a planar layout) as viewed from direction A-A in FIG. 1. The cross-sectional view in the vertical direction as viewed from direction C-C in FIG. 2 corresponds to FIG. 1. As illustrated in FIG. 2, the lower buried regions 4a to 4m are formed in a lattice form in the planar pattern. The lower buried regions 4a to 4e serve as a plurality of stripe parts extending parallel to each other in the vertical direction in FIG. 3. The lower buried regions 4f to 4m serve as connection parts extending in a direction perpendicular to the extending direction of the lower buried regions 4a to 4e (in the lateral direction in FIG. 2) and connected to the lower buried regions 4a to 4e. The lower regions 2a to 2f are provided to be surrounded by the lower buried regions 4a to 4m.

Figure 3:
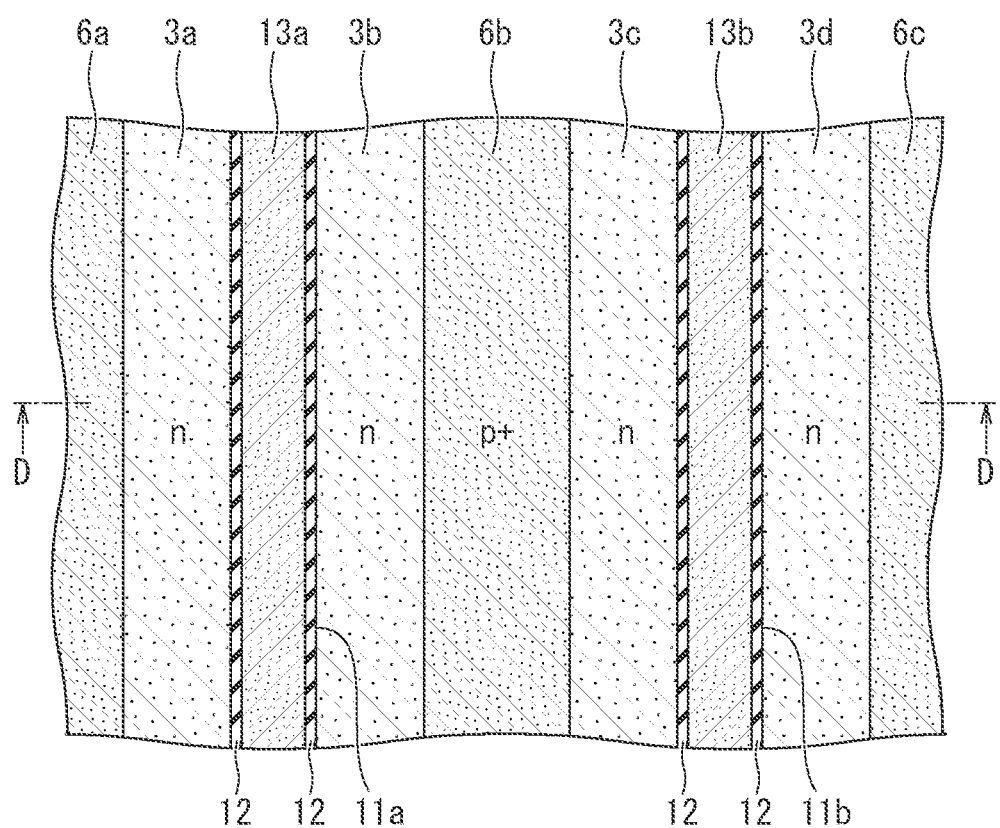
FIG. 3 is a horizontal cross-sectional view as viewed from direction B-B in FIG. 1.

FIG. 3 corresponds to a horizontal cross-sectional view (a planar layout) as viewed from direction B-B in FIG. 1. The cross-sectional view in the vertical direction as viewed from direction D-D in FIG. 3 corresponds to FIG. 1. As illustrated in FIG. 3, the trenches 11a and 11b are formed into a stripe shape extending parallel to each other in the vertical direction in FIG. 3 in a planar pattern. The gate electrodes 13a and 13b are provided inside the trenches 11a and 11b via the gate insulating film 12. The upper regions 3a to 3d and the upper buried regions 6a to 6c are interposed between the respective trenches 11a and 11b. The upper regions 3a to 3d and the upper buried regions 6a to 6c are formed into a stripe shape extending parallel to each other in the vertical direction in FIG. 3. The planar pattern of the trenches 11a and 11b is not limited to the stripe shape, and may be a polygonal shape such as a hexagon.

An interlayer insulating film 14 is deposited on the gate electrodes 13a and 13b. The interlayer insulating film 14 to be used may be a silicon oxide film (a $SiO_2$ film) without containing phosphorus (P) or boron (B) which is referred to as a non-doped silicate glass (NSG) film. The interlayer insulating film 14 may also be a phosphosilicate glass film (a PSG film), a borosilicate glass film (a BSG film), a single-layer film of a borophosphosilicate glass film (a BPSG film) or a silicon nitride ($Si_3N_4$) film, or a composite film of any of the above films combined together.

A first main electrode (a source electrode) (15 to 18) is deposited on and in contact with the source regions 10a to 10d and the base contact regions 9a to 9c. The source electrode (15 to 18) includes, for example, a source contact layer 15 provided in contact with the top surfaces of the base contact regions 9a to 9c, barrier metal layers 16 and 17 provided in contact with the top surface and the side surface of the source contact layer 15 to cover the interlayer insulating film 14, and a metal layer 18 provided in contact with the barrier metal layer 17.

A material used for the source contact layer 15 may be nickel silicide (NiSix), for example. A material used for the barrier metal layers 16 and 17 may be titanium (Ti) or titanium nitride (TiN), for example. A material used for the metal layer 18 may be aluminum (Al) or an Al—Si alloy, for example.

A carrier reception region (a drain region) 11 of $n^+$-type is deposited on the bottom surface of the drift layer 1. The drain region 11 is formed of a SiC substrate, for example. The drain region 11 has a higher impurity concentration than the drift layer 1. The impurity concentration of the drain region 11 is about $1\times10^{17}$ cm$^{-3}$ or greater and $1\times10^{20}$ cm$^{-3}$ or less, for example.

A second main electrode (a drain electrode) (19 to 22) is deposited on the bottom surface of the drain region 11. The drain electrode (19 to 22) has a structure including, sequentially from the bottom side of the drain region 11, a first metal layer 19, a second metal layer 20, a third metal layer 21, and a fourth metal layer 22 stacked on one another, for example. The first metal layer 19 is a silicide of metal such as titanium (Ti), molybdenum (Mo), tungsten (W), and nickel (Ni), or a carbide layer. The second metal layer 20 is an aluminum (Al) film or a titanium (Ti) film, for example. The third metal layer 21 is a nickel (Ni) film or an alloy (Ni-p) mainly containing Ni, for example. The fourth metal layer 22 is made of gold (Au), for example.

Upon the operation of the insulated gate semiconductor device according to the embodiment of the present invention, a positive voltage is applied to the drain electrode (19 to 22), and a positive voltage of a threshold or greater is applied to the gate electrodes 13a and 13b, so as to form an inversion channel at a part of each of the base regions 8a to 8c and the high-concentration regions 5a to 5c in contact with the trenches 11a and 11b to be led to the ON-state, and cause a main current of majority carriers (electrons) to flow through. When the voltage applied to the gate electrodes 13a and 13b is less than the threshold, no inversion channel is formed in the base regions 8a to 8c including the high-concentration regions 5a to 5c so as to be led to the OFF-state. This does not cause the main current to flow through.

Figure 4:
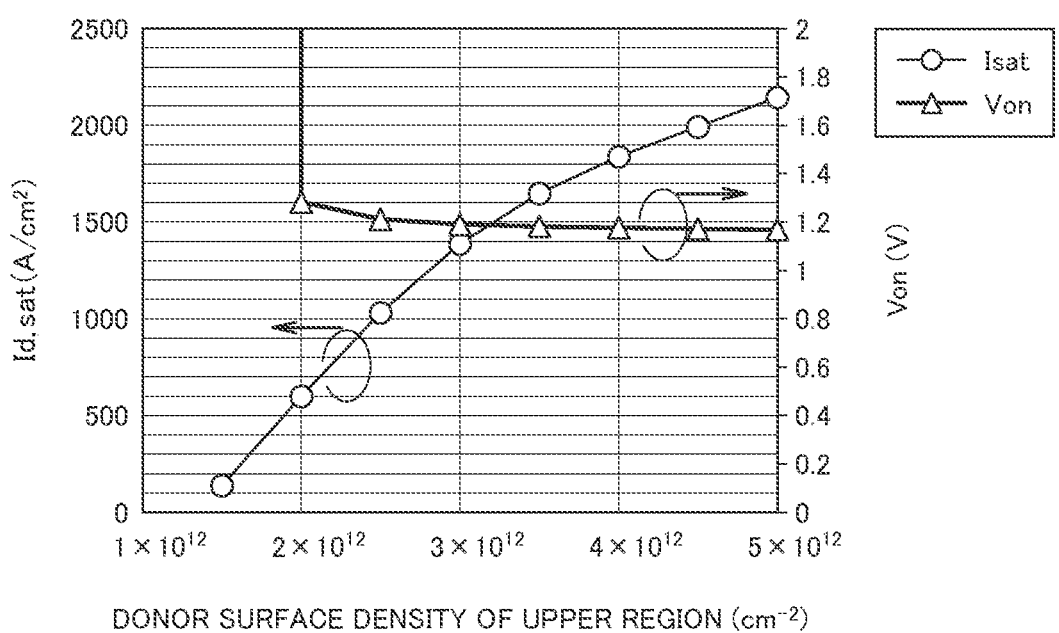
FIG. 4 is a graph showing a relation between a donor surface density of an upper region and a saturation current and an ON voltage.

FIG. 4 shows results of a simulation for evaluating a relation between a surface density (a donor surface density) of the n-type impurity ions in the upper regions 3a to 3d and a saturation current Id, sat and an ON voltage Von when the donor surface density of the upper regions 3a to 3d is changed in the insulated gate semiconductor device according to the embodiment of the present invention. As shown in FIG. 4, an increase in the ON voltage Von can be suppressed and the saturation current Id, sat can be decreased when the donor surface density of the upper regions 3a to 3d is set to $2\times10^{12}$ cm$^{-2}$ or greater, namely, the impurity concentration is set to $4\times10^{16}$ cm$^{-3}$ or greater when the thickness of the upper regions 3a to 3d is set to 0.5 μm, so as to improve the short-circuit fault tolerance.

Figure 5:
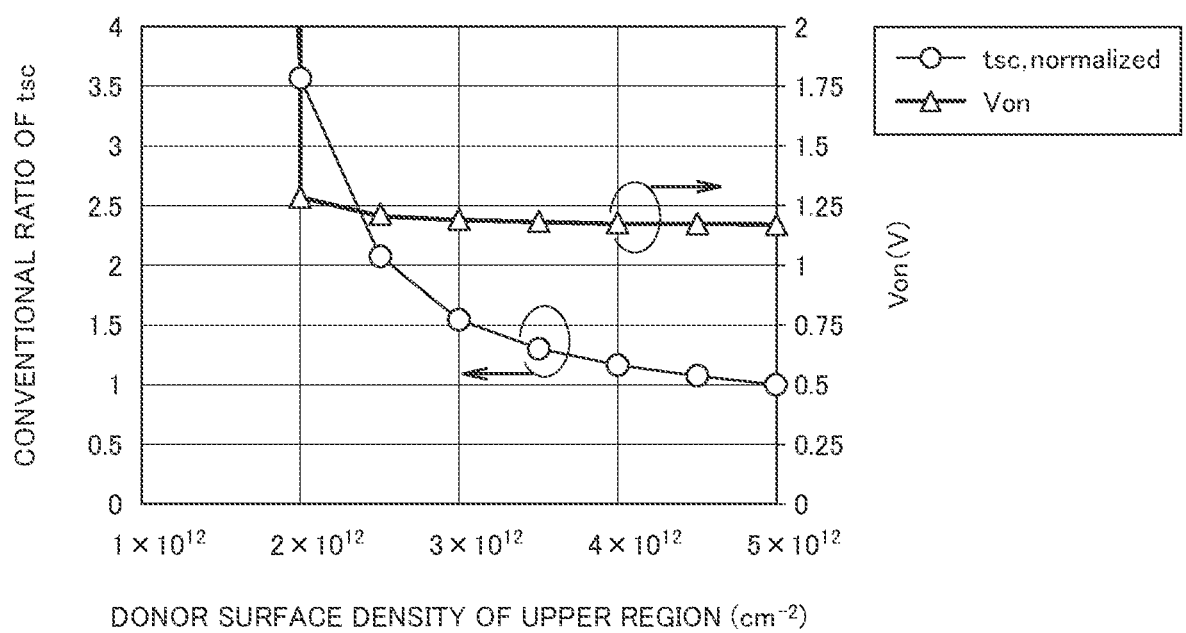
FIG. 5 is a graph showing a relation between the donor surface density of the upper region and a conventional ratio of delay time of short-circuit protection and the ON voltage.

FIG. 5 shows results of a simulation for evaluating a relation between the donor surface density of the upper regions 3a to 3d and a conventional ratio of a delay time tsc of short-circuit protection and the ON voltage Von when the donor surface density of the upper regions 3a to 3d is changed in the insulated gate semiconductor device according to the embodiment of the present invention. The conventional ratio of the delay time tsc of the short-circuit protection is a ratio of the impurity concentration of the upper regions 3a to 3d set to $1\times10^{17}$ cm$^{-3}$ to the delay time tsc of the short-circuit protection. Setting the donor surface density of the upper regions 3a to 3d to $2\times10^{12}$ cm$^{-2}$ or greater, namely, setting the impurity concentration to $4\times10^{16}$ cm$^{-3}$ or greater when the thickness of the upper regions 3a to 3d is 0.5 μm, can increase the delay time tsc of the short-circuit protection while avoiding an increase in the ON voltage Von, so as to improve the short-circuit fault tolerance. To improve the short-circuit fault tolerance, the donor surface density of the upper regions 3a to 3d is preferably set to $3\times10^{12}$ cm$^{-2}$ or less, namely, the impurity concentration is preferably set to $6\times10^{16}$ cm$^{-3}$ or less when the thickness of the upper regions 3a to 3d is 0.5 μm.

Figure 6:
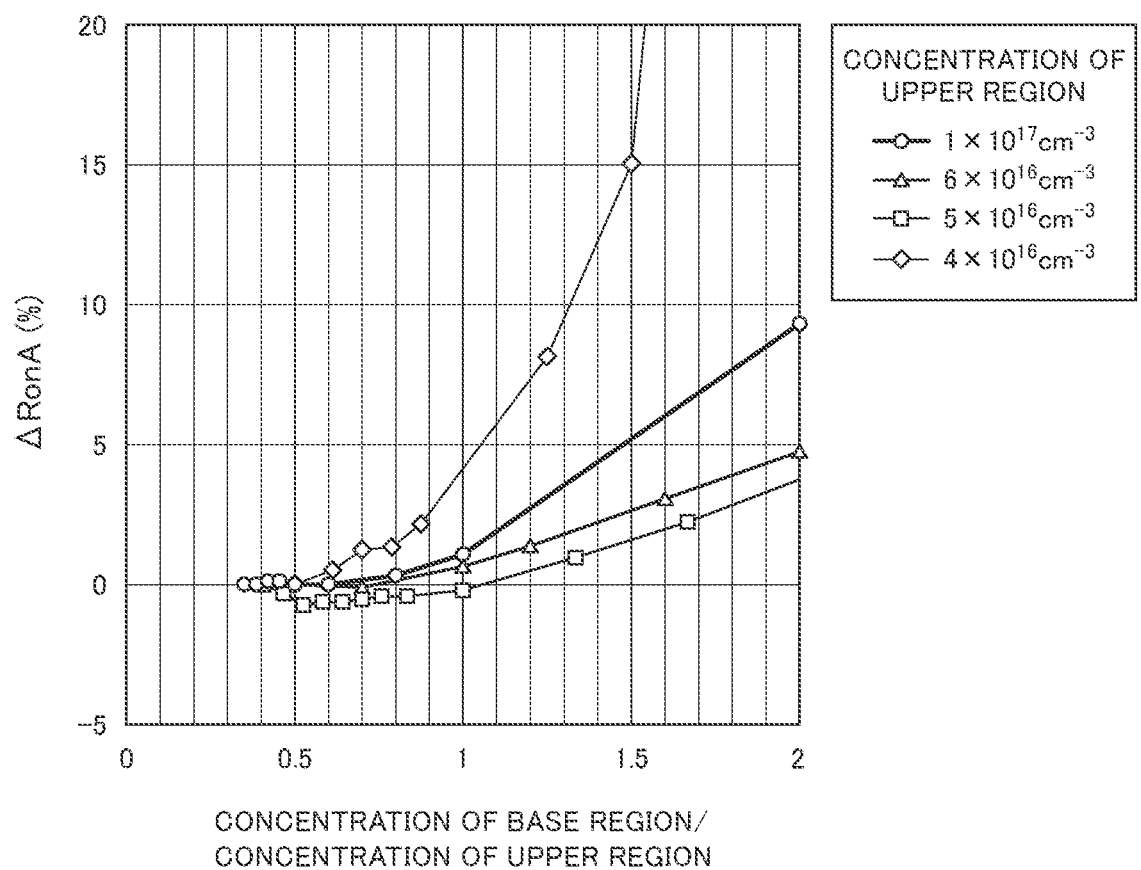
FIG. 6 is a graph showing a relation between a ratio of an impurity concentration of a base region to an impurity concentration of the upper region and an increased rate of the ON resistance.

FIG. 6 shows results of a simulation for evaluating a relation between a ratio of the impurity concentration of the base regions 8a to 8c to the impurity concentration of the upper regions 3a to 3d (also simply referred to below as a "concentration ratio") and an increased rate ΔRonA of the ON resistance when the impurity concentration of the upper regions 3a to 3d and the concentration ratio are changed in the insulated gate semiconductor device according to the embodiment of the present invention. As illustrated in FIG. 6, setting the impurity concentration of the upper regions 3a to 3d to $4\times10^{16}$ cm$^{-3}$ or greater and $6\times10^{16}$ cm$^{-3}$ or less, and setting the concentration ratio to 0.5 or greater and 1.0 or smaller can suppress the increased rate ΔRonA of the ON resistance to 5% or less. In addition, setting the impurity concentration of the upper regions 3a to 3d to $5\times10^{16}$ cm$^{-3}$ or greater and $6\times10^{16}$ cm$^{-3}$ or less, and setting the concentration ratio to 0.5 or greater and 2 or smaller can suppress the increased rate ΔRonA of the ON resistance to 5% or less. While the increase in the ON resistance generates elements in which the ON voltage exceeds an upper standard to decrease a high-quality rate of a product, the suppression in the increased rate ΔRonA of the ON resistance to 5% or less can absorb the increase of the ON resistance due to a reduction in thickness of a wafer or a reduction in resistance of the drift layer 1, so as to keep the high-quality rate.

Figure 7:
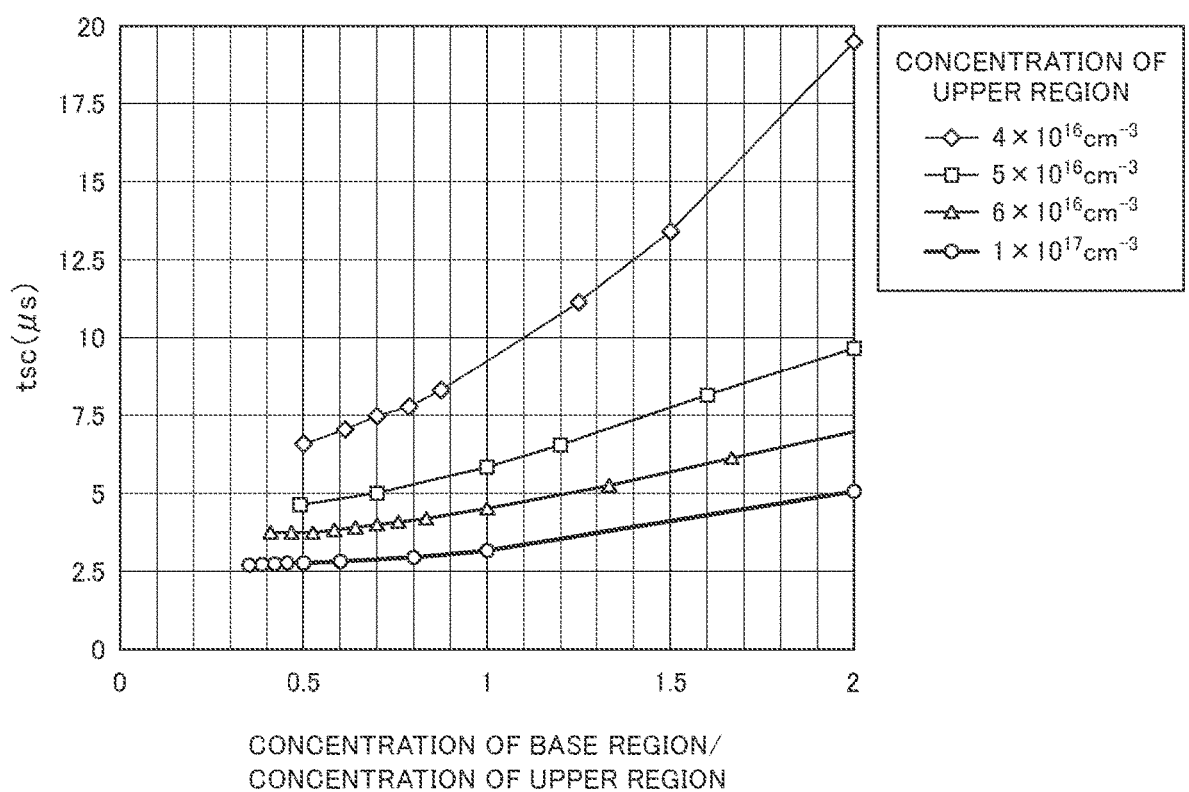
FIG. 7 is a graph showing a relation between the ratio of the impurity concentration of the base region to the impurity concentration of the upper region and the delay time of the short-circuit protection.

FIG. 7 shows results of a simulation for evaluating a relation between the ratio (the concentration ratio) of the impurity concentration of the base regions 8a to 8c to the impurity concentration of the upper regions 3a to 3d and the delay time tsc of the short-circuit protection when the impurity concentration of the upper regions 3a to 3d and the concentration ratio are changed in the insulated gate semiconductor device according to the embodiment of the present invention. As illustrated in FIG. 7, setting the impurity concentration of the upper regions 3a to 3d to $4\times10^{16}$ cm$^{-3}$ or greater and $6\times10^{16}$ cm$^{-3}$ or less, and setting the concentration ratio to 1.2 or greater and 2 or smaller can increase the delay time tsc of the short-circuit protection to 5 μs or greater. In addition, setting the impurity concentration of the upper regions 3a to 3d to $4\times10^{16}$ cm$^{-3}$ or greater and $5\times10^{16}$ cm$^{-3}$ or less, and setting the concentration ratio to 0.5 or greater and 2 or smaller can increase the delay time tsc of the short-circuit protection to 5 μs or greater. The increase in the delay time tsc of the short-circuit protection to 5 μs or greater can ensure the short-circuit protection only by use of the elements themselves with no addition of any external short-circuit protection circuits.

The insulated gate semiconductor device according to the embodiment of the present invention, when setting the impurity concentration of the upper regions 3a to 3d to $4\times10^{16}$ cm$^{-3}$ or greater and $6\times10^{16}$ cm$^{-3}$ or less, and setting the ratio (the concentration ratio) of the impurity concentration of the base regions 8a to 8c to the impurity concentration of the upper regions 3a to 3d to 0.5 or greater and 2 or smaller, can increase the delay time tsc of the short-circuit protection while suppressing the increased rate ΔRonA of the ON resistance, namely, can improve the short-circuit fault tolerance while avoiding an increase in the ON resistance.

In addition, setting the impurity concentration of the upper regions 3a to 3d to $4\times10^{16}$ cm$^{-3}$ or greater and $5\times10^{16}$ cm$^{-3}$ or less, and setting the ratio (the concentration ratio) of the impurity concentration of the base regions 8a to 8c to the impurity concentration of the upper regions 3a to 3d to 0.5 or greater and 1 or smaller, can increase the delay time tsc of the short-circuit protection to 5 μs or greater while suppressing the increased rate ΔRonA of the ON resistance to 5% or less.

In addition, setting the impurity concentration of the upper regions 3a to 3d to $5\times10^{16}$ cm$^{-3}$ or greater and $6\times10^{16}$ cm$^{-3}$ or less, and setting the ratio (the concentration ratio) of the impurity concentration of the base regions 8a to 8c to the impurity concentration of the upper regions 3a to 3d to 1.2 or greater and 2 or smaller, can increase the delay time tsc of the short-circuit protection to 5 μs or greater while suppressing the increased rate ΔRonA of the ON resistance to 5% or less.

<Method of Manufacturing Insulated Gate Semiconductor Device>

A method of manufacturing the insulated gate semiconductor device according to the embodiment of the present invention is described below with reference to FIG. 8 to FIG. 16. The manufacturing method is described below while focusing on the cross section of the insulated gate semiconductor device illustrated in FIG. 1. The method of manufacturing the gate insulated semiconductor device described below is an example, and it should be understood that the insulated gate semiconductor device can be manufactured by any other methods including modified examples of this embodiment within the scope of the appended claims.

Figure 8:
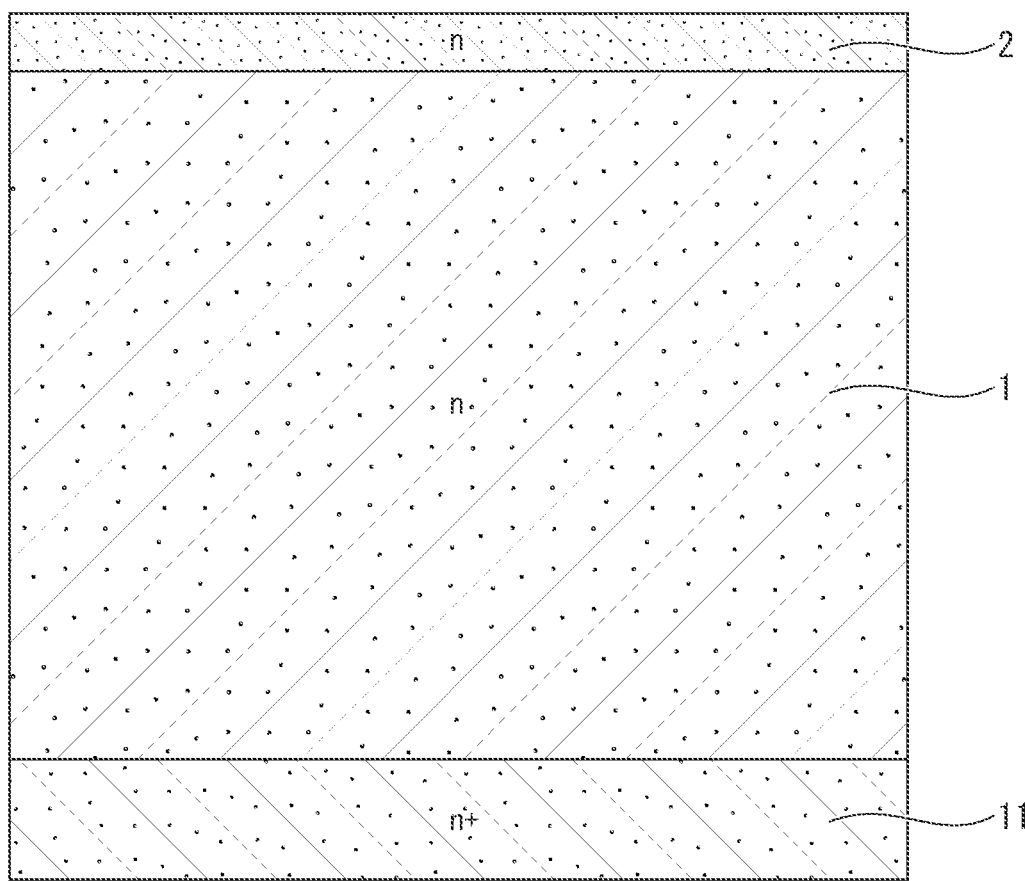
FIG. 8 is a cross-sectional process view for explaining a method of manufacturing the insulated gate semiconductor device according to the embodiment of the present invention.

First, a SiC substrate of n$^+$-type with which n-type impurity ions such as nitrogen (N) are heavily doped is prepared so as to be used as the drain region 11. Next, the n-type drift layer 1 is epitaxially grown on the SiC substrate. Next, as illustrated in FIG. 8, n-type impurity ions such as nitrogen (N) are implanted to the entire surface of the drift layer 1. The stacked structure including the drain region 11, the drift layer 1, and the lower region 2 is thus formed, as illustrated in FIG. 8.

Figure 9:
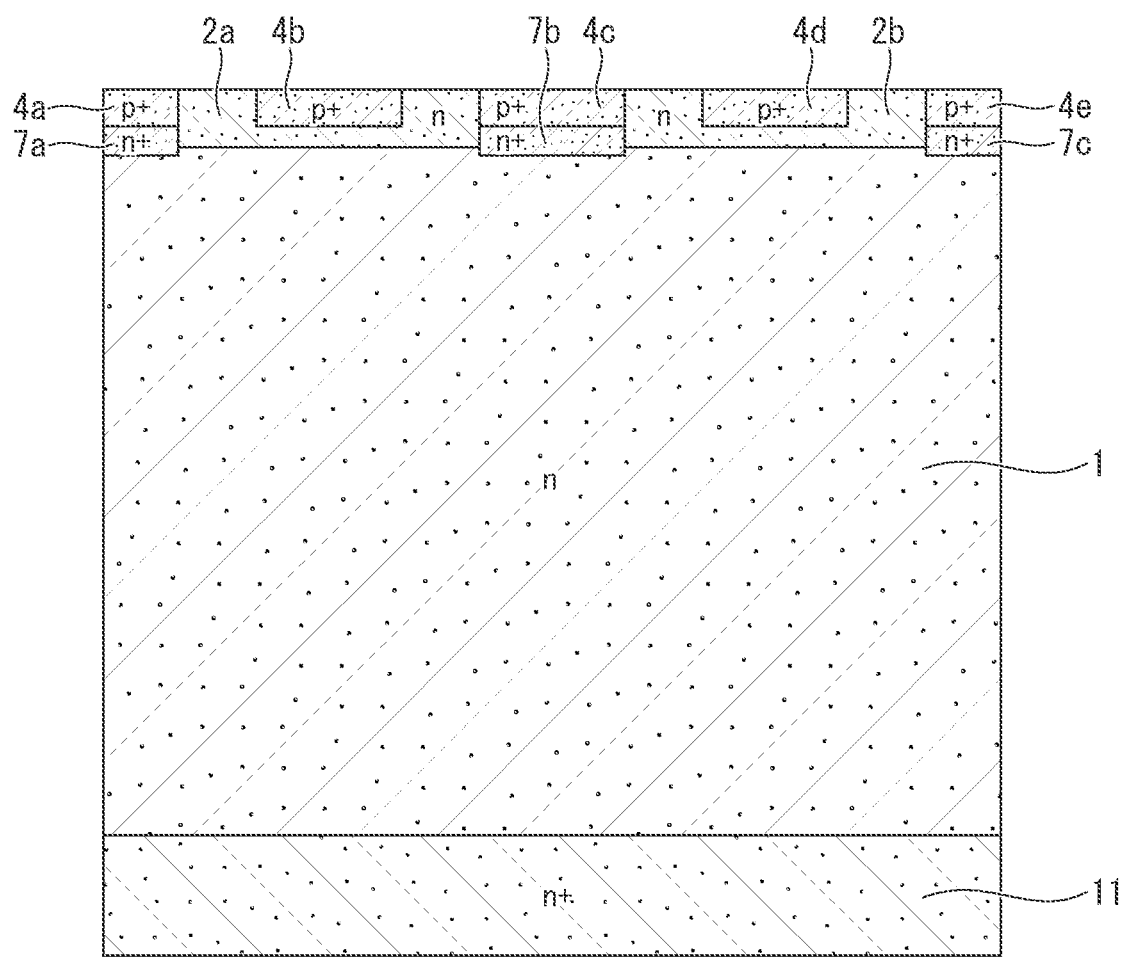
FIG. 9 is a cross-sectional process view continued from FIG. 8 for explaining the method of manufacturing the insulated gate semiconductor device according to the embodiment of the present invention.

Next, a photoresist film is applied on the top surface of the lower region 2, and is then delineated by photolithography. Using the delineated photoresist film as a mask, n-type impurity ions such as nitrogen (N) are implanted. Another photoresist film is further applied on the top surface of the lower region 2 after the removal of the photoresist film, and is then delineated by photolithography. Using the delineated photoresist film as a mask, p-type impurity ions such as aluminum (Al) are implanted. The execution of the subsequent annealing after the removal of the photoresist film activates the n-type impurity ions and the p-type impurity ions. As a result, the n$^+$-type partial current spreading layers 7a to 7c are selectively formed at the lower part of the lower region 2, as illustrated in FIG. 9. In addition, the p$^+$-type lower buried regions 4a to 4e are also selectively formed at the upper part of the lower region 2. The annealing for forming the partial current spreading layers 7a to 7c and the annealing for forming the lower buried regions 4a to 4e are not necessarily executed in the same step, and the respective annealing steps may be executed independently of each other.

Figure 10:
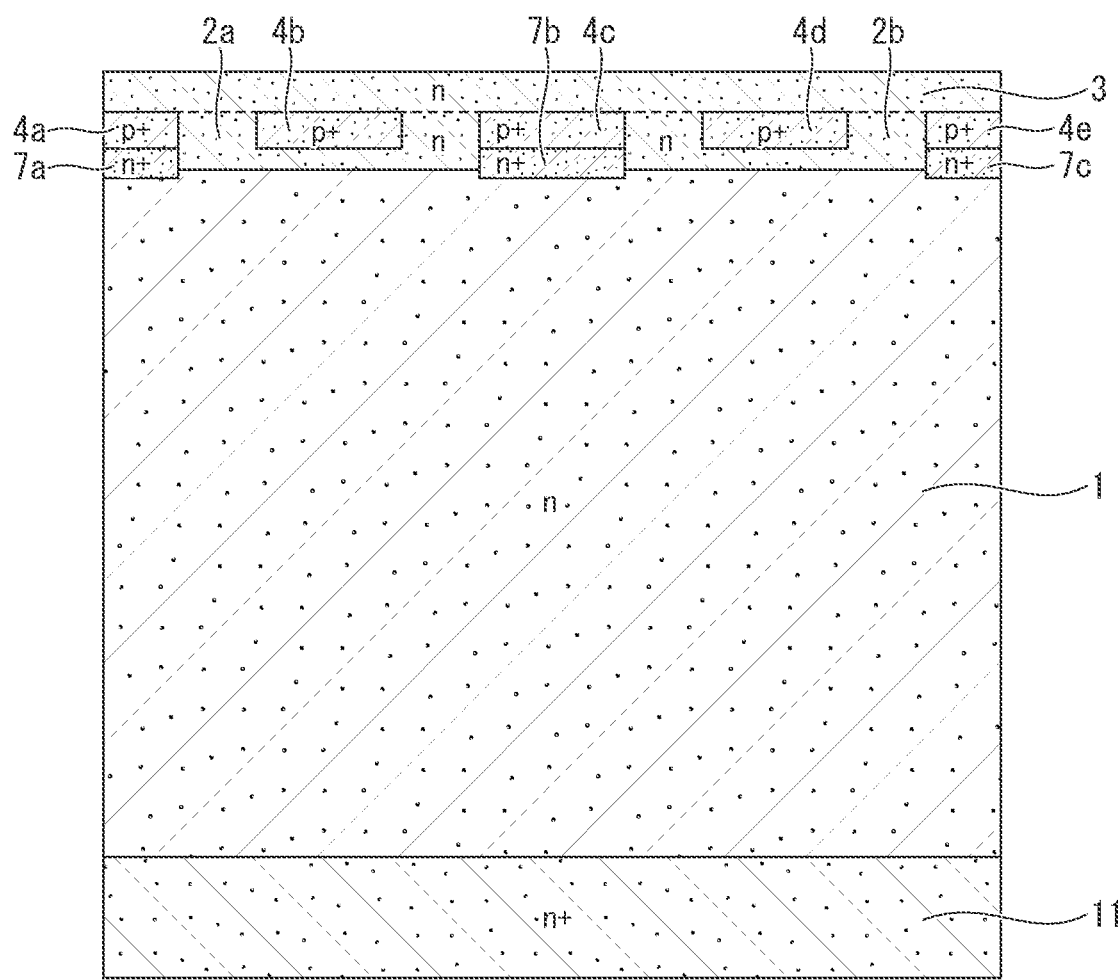
FIG. 10 is a cross-sectional process view continued from FIG. 9 for explaining the method of manufacturing the insulated gate semiconductor device according to the embodiment of the present invention.
Figure 11:
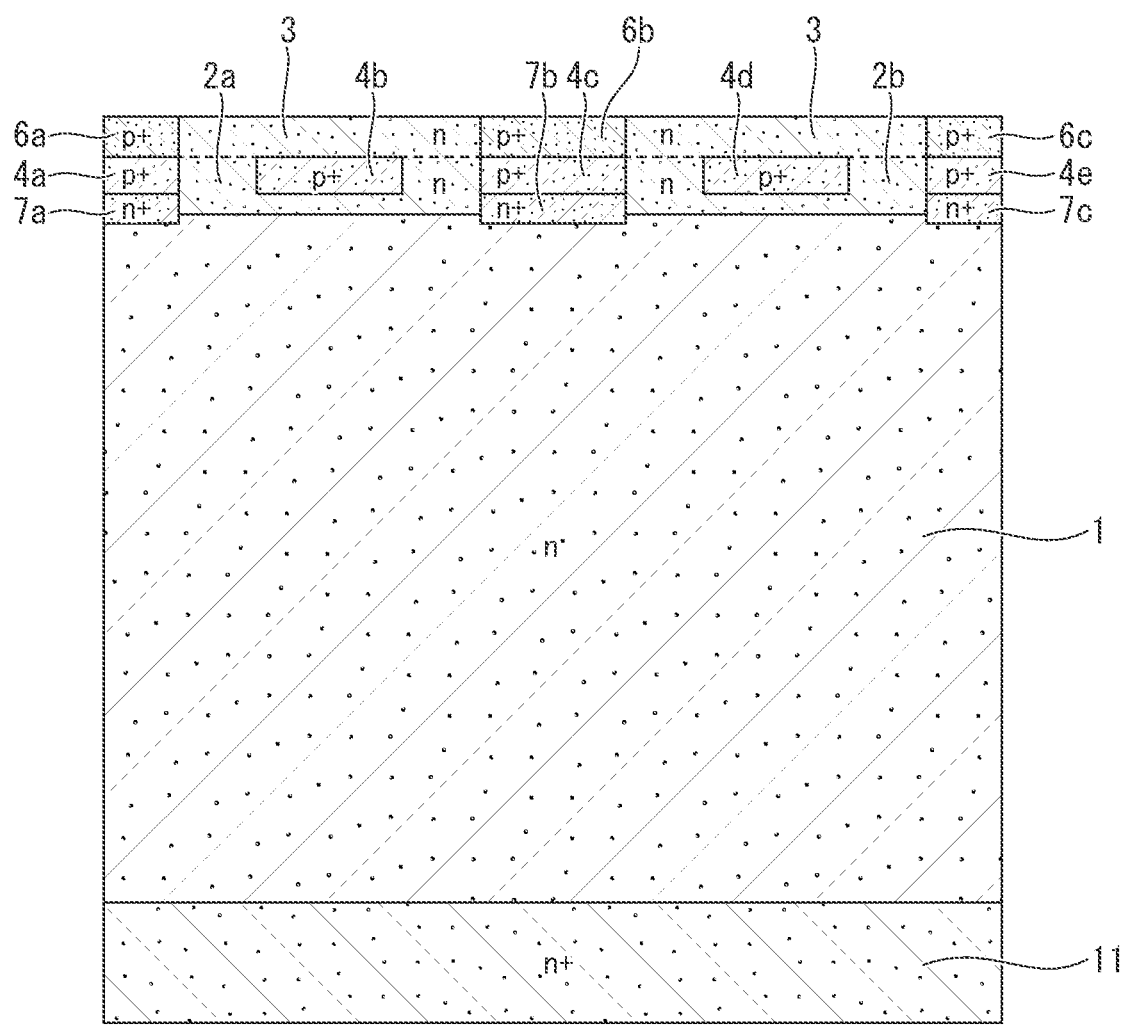
FIG. 11 is a cross-sectional process view continued from FIG. 10 for explaining the method of manufacturing the insulated gate semiconductor device according to the embodiment of the present invention.

Next, as illustrated in FIG. 10, the n-type upper region 3 is epitaxially grown on the top surfaces of the lower regions 2a and 2b and the lower buried regions 4a to 4e. Then, n-type impurity ions such as nitrogen (N) may be implanted to the entire surface of upper region 3. A photoresist film is applied on the top surface of the upper region 3, and is then delineated by photolithography. Using the delineated photoresist film as a mask, p-type impurity ions such as Al are implanted. The execution of the subsequent annealing after the removal of the photoresist film activates the p-type impurity ions. As a result, the p$^+$-type upper buried regions 6a to 6c are selectively formed inside the upper region 3, as illustrated in FIG. 11.

Figure 12:
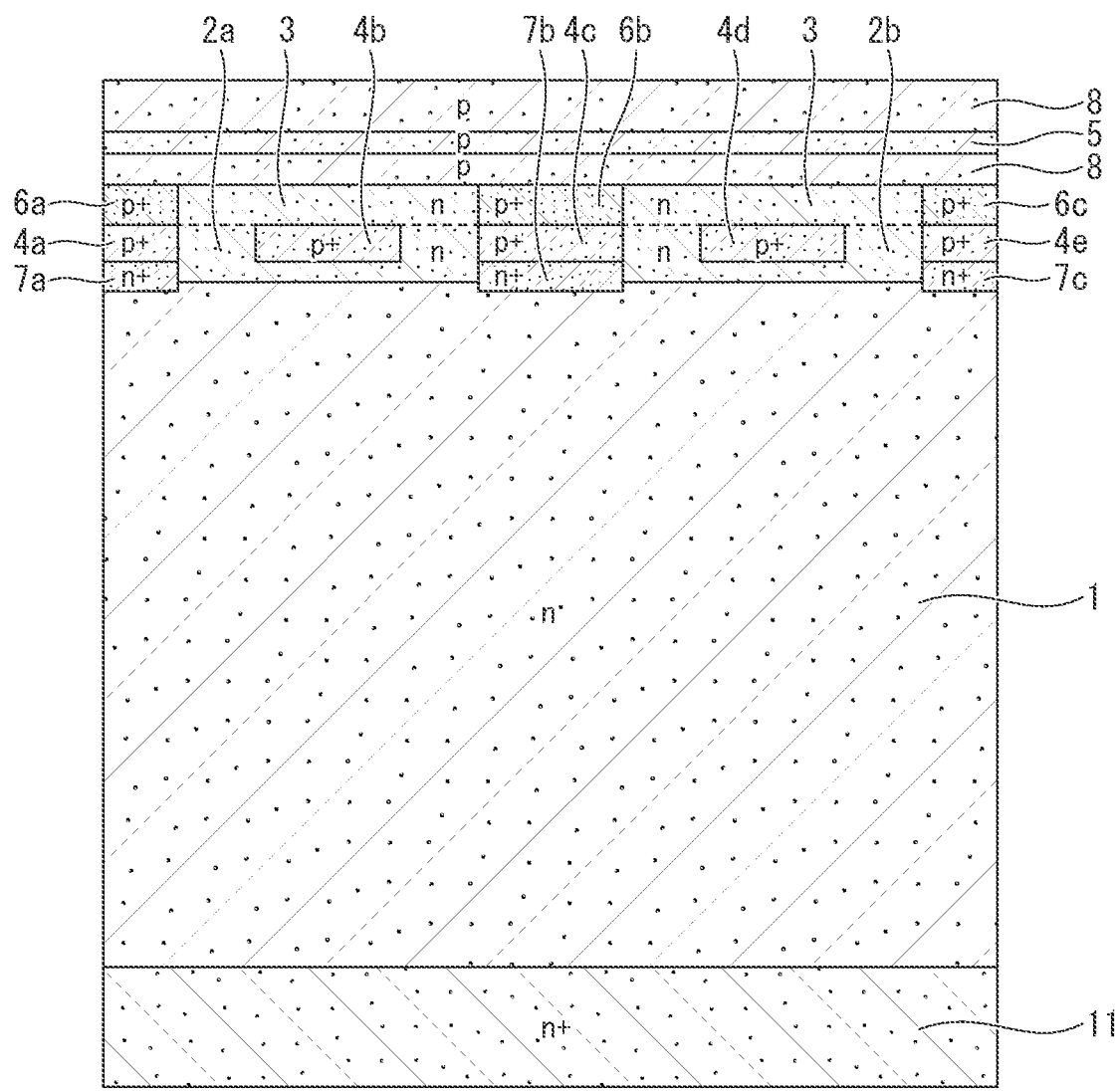
FIG. 12 is a cross-sectional process view continued from FIG. 11 for explaining the method of manufacturing the insulated gate semiconductor device according to the embodiment of the present invention.
Figure 13:
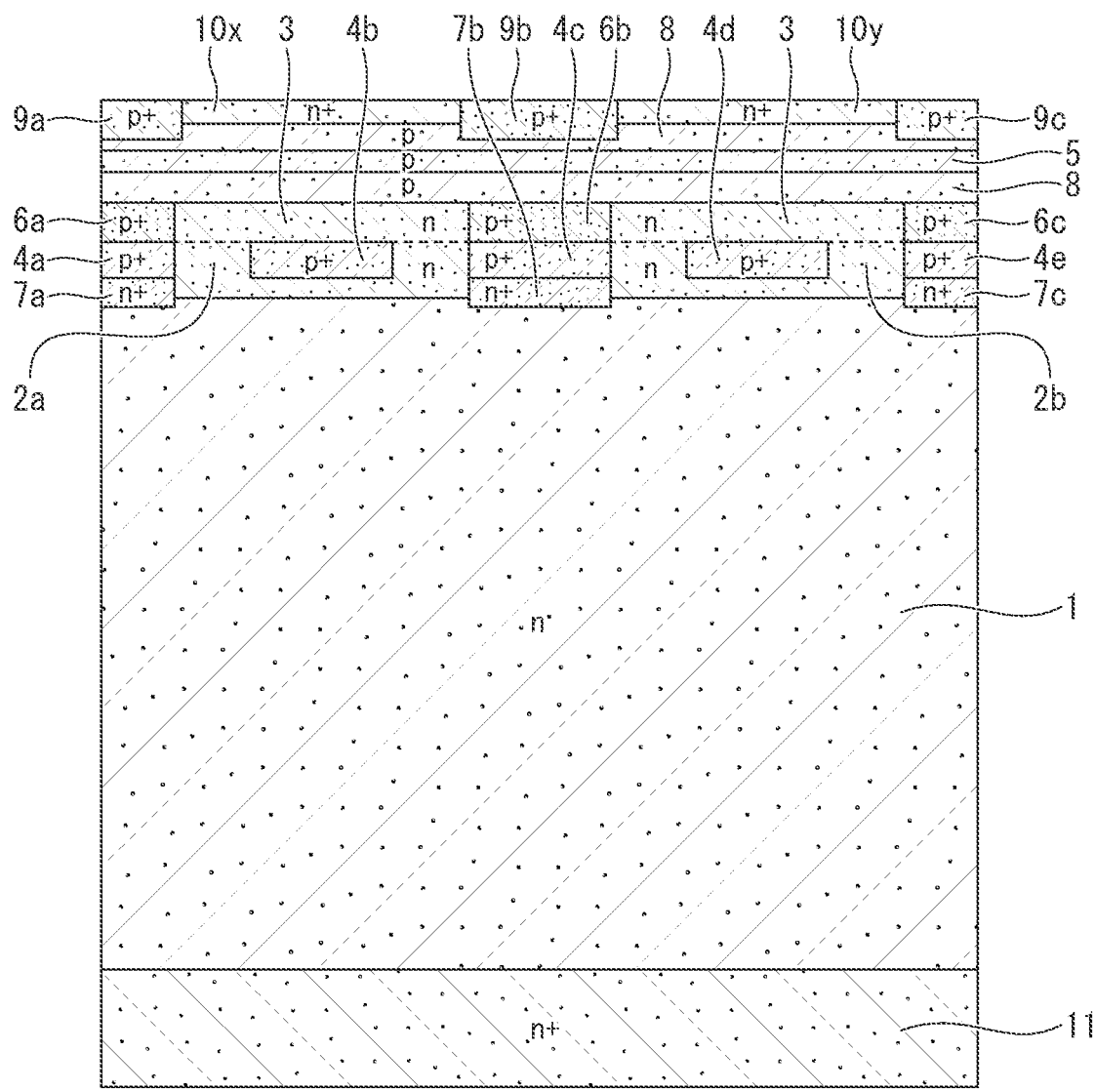
FIG. 13 is a cross-sectional process view continued from FIG. 12 for explaining the method of manufacturing the insulated gate semiconductor device according to the embodiment of the present invention.

Next, the p-type base region 8 is epitaxially grown on the top surfaces of the upper region 3 and the upper buried regions 6a to 6c. Then, p-type impurity ions such as aluminum (Al) are implanted to the entire surface of the base region 8, so as to form the high-concentration region 5 in the middle part of the base region 8 in the depth direction. FIG. 12 illustrates the state at this point. A photoresist film is then applied on the top surface of the base region 8, and is delineated by photolithography. Using the delineated photoresist film as a mask, n-type impurity ions such as nitrogen (N) are implanted. Another photoresist film is further applied on the top surface of the base region 8 after the removal of the photoresist film, and is then delineated by photolithography. Using the delineated photoresist film as a mask, p-type impurity ions such as Al are implanted. The execution of the subsequent annealing after the removal of the photoresist film activates the n-type impurity ions and the p-type impurity ions. As a result, the n$^+$-type source regions 10x and 10y and the p$^+$-type base contact regions 9a to 9c are selectively formed at the upper part of the base region 8, as illustrated in FIG. 13. The annealing for forming the source regions 10x and 10y and the annealing for forming the base contact regions 9a to 9c are not necessarily executed in the same step, and the respective annealing steps may be executed independently of each other.

Figure 14:
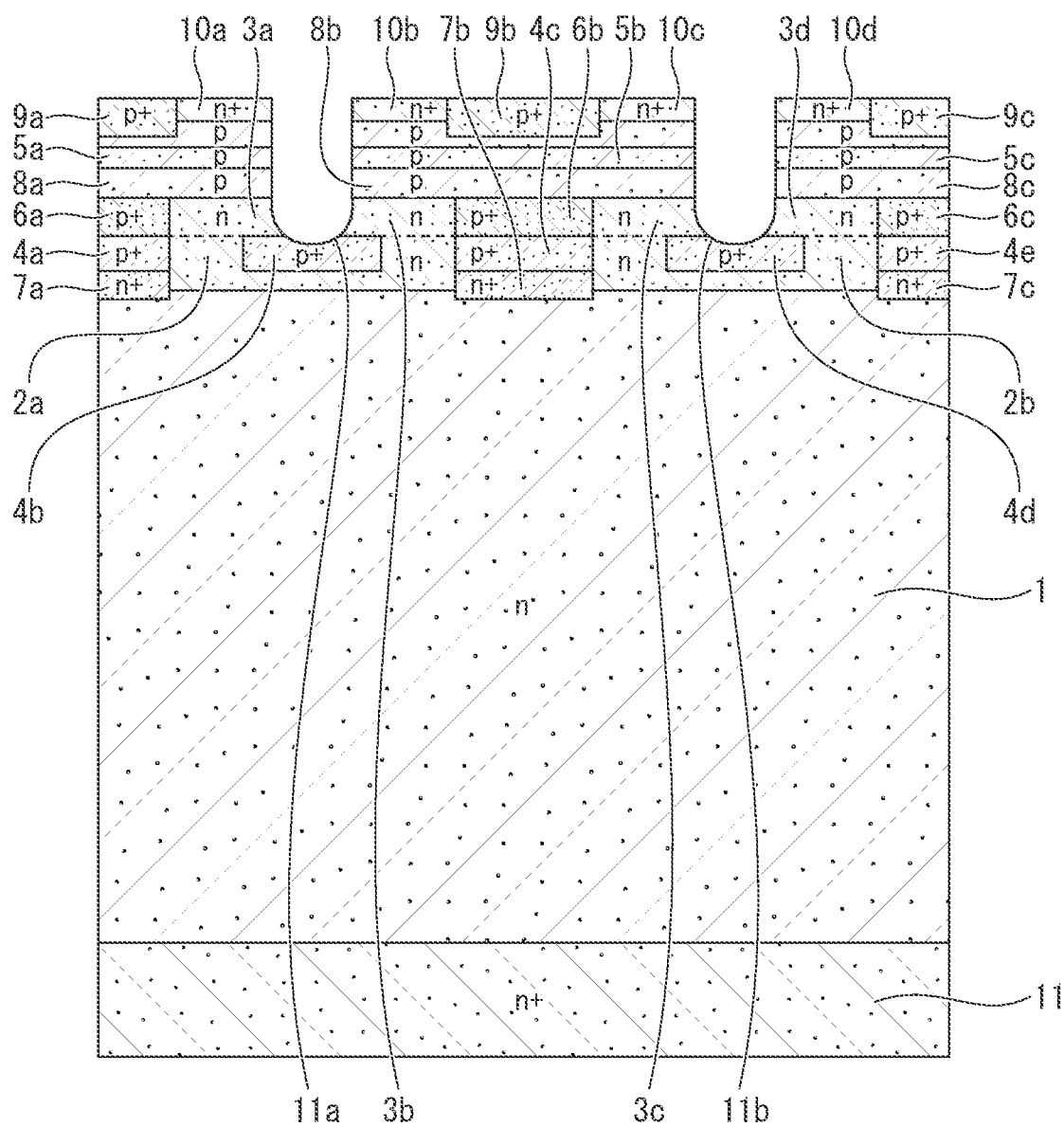
FIG. 14 is a cross-sectional process view continued from FIG. 13 for explaining the method of manufacturing the insulated gate semiconductor device according to the embodiment of the present invention.

Next, a photoresist film is applied on the respective top surfaces of the source regions 10x and 10y and the base contact regions 9a to 9c, and is then delineated by photolithography. Using the delineated photoresist film as a mask for etching, the source regions 10x, and 10y, the base region 8, the high-concentration region 5, and the upper region 3 are partly removed in the depth direction by dry etching such as reactive ion etching (ME). The photoresist film is then removed. Instead of the photoresist film, an oxide film may be delineated as the mask for etching. As a result, the trenches 11a and 11b reaching the lower buried regions 4b and 4d are selectively formed, as illustrated in FIG. 14.

Figure 15:
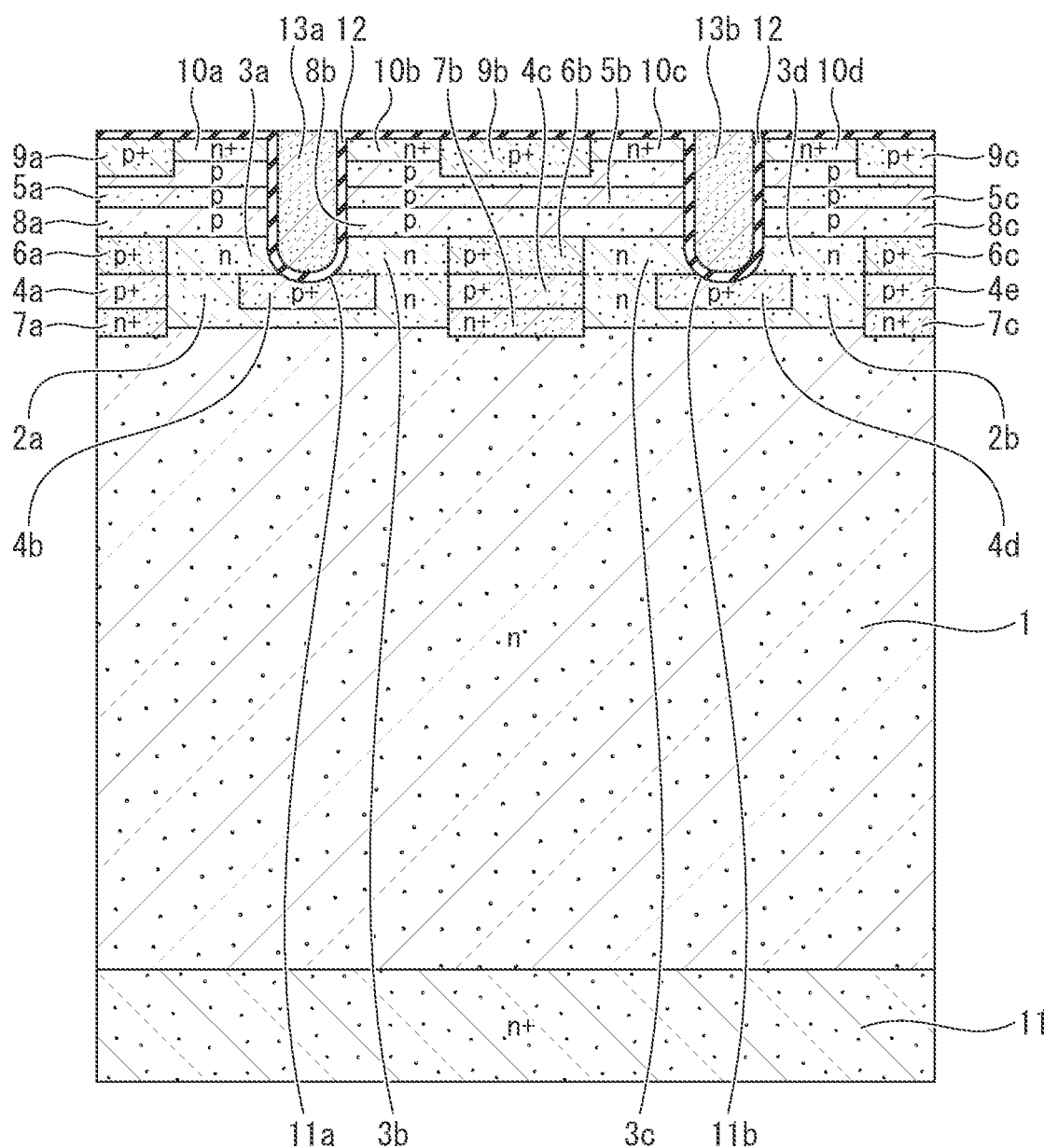
FIG. 15 is a cross-sectional process view continued from FIG. 14 for explaining the method of manufacturing the insulated gate semiconductor device according to the embodiment of the present invention.
Figure 16:
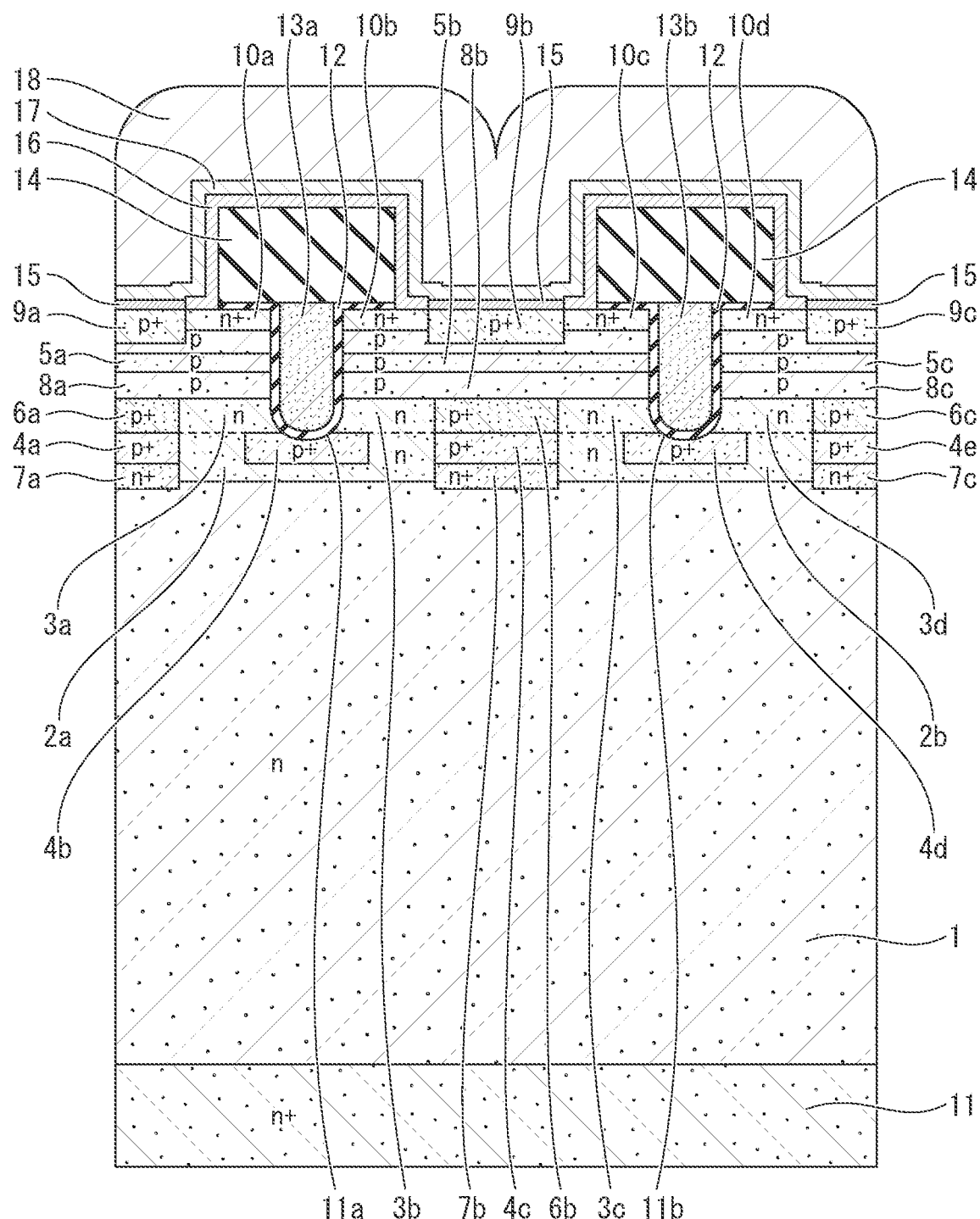
FIG. 16 is a cross-sectional process view continued from FIG. 15 for explaining the method of manufacturing the insulated gate semiconductor device according to the embodiment of the present invention.

Next, the gate insulating film 12 is formed on the bottom surfaces and the side surfaces of the trenches 11a and 11b and the respective top surfaces of the source regions 10a to 10d and the base contact regions 9a to 9c by a thermal oxidation method or a chemical vapor deposition (CVD) method. The CVD method using dopant gas causes a polysilicon layer (a doped polysilicon layer) to be deposited with which p-type impurity ions such as Al are heavily doped so as to fill the trenches 11a and 11b. The doped polysilicon layer is then selectively removed by photolithography and dry etching. As a result, the patterns of the gate electrodes 13a and 13b formed of the doped polysilicon layer are formed so as to provide the insulated gate structures (12 and 13a), (12 and 13b), as illustrated in FIG. 15.

Next, the interlayer insulating film 14 is deposited on the top surfaces of the insulated gate structures (12 and 13a), (12 and 13b) by a CVD method, for example. The interlayer insulating film 14 and the gate insulating film 12 are then selectively removed by photolithography and dry etching. The execution of the subsequent annealing after the deposition of a Ni film on the entire surface by sputtering causes SiC on the surfaces of the source regions 10a to 10d and the base contact regions 9a to 9c to react with the Ni film. Removing the Ni film not reacted further forms the source contact layer 15 formed of NiSi$_x$ selectively at a part in which the interlayer insulating film 14 is removed. Further, the barrier metal layers 16 and 17 and the source electrode 18 are formed on the interlayer insulating film 14 by use of sputtering, photolithography, and RIE.

Next, the thickness of the drain region 11 is adjusted by chemical mechanical polishing (CMP), for example. The drain electrode (19 to 22) is then formed on the bottom surface of the drain region 11 by sputtering or a vapor deposition method, for example. The insulated gate semiconductor device according to the embodiment illustrated in FIG. 1 is thus completed.

Modified Example

Figure 17:
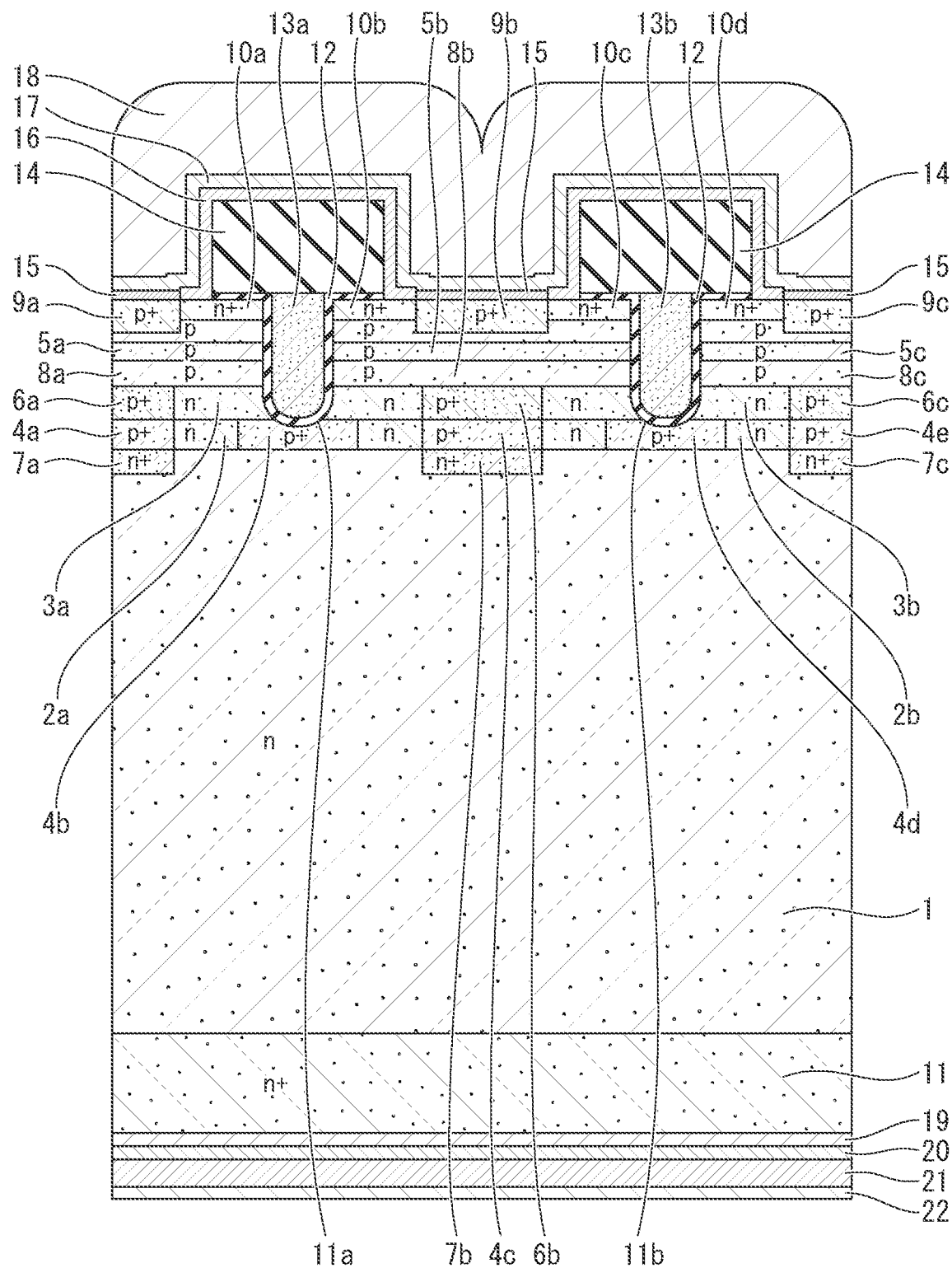
FIG. 17 is a cross-sectional view illustrating a main part of an insulated gate semiconductor device according to a modified example of the embodiment of the present invention.

An insulated gate semiconductor device according to a modified example of the embodiment of the present invention differs from the insulated gate semiconductor device according to the embodiment in that the depth of the bottom surfaces of the lower regions 2a and 2b conforms to the depth of the bottom surfaces of the lower buried regions 4a to 4e, as illustrated in FIG. 17. The other configurations of the insulated gate semiconductor device according to the modified example of the embodiment of the present invention are the same as those of the insulated gate semiconductor device according to the embodiment of the present invention, and overlapping explanations are not repeated below.

The insulated gate semiconductor device according to the modified example of the embodiment of the present invention, in which the depth of the bottom surfaces of the lower regions 2a and 2b conforms to the depth of the bottom surfaces of the lower buried regions 4a to 4e, can also achieve the effects similar to those of the insulated gate semiconductor device according to the embodiment of the present invention.

Upon the manufacture of the insulated gate semiconductor device according to the modified example of the embodiment of the present invention, the epitaxially-grown layers composing the lower regions 2a and 2b only need to be formed after the n$^+$-type partial current spreading layers 7a to 7c are formed at the upper part of the n-type drift layer 1 by the ion implantation and the annealing.

Other Embodiments

While the present invention has been described above by reference to the embodiment, it should be understood that the present invention is not intended to be limited to the descriptions and the drawings composing part of this disclosure. Various alternative embodiments, examples, and technical applications will be apparent to those skilled in the art according to this disclosure.

For example, while the embodiment of the present invention has been illustrated above with the case in which the lower regions 2a and 2b and the upper regions 3a to 3d included in the high-concentration layer (2a, 2b, and 3a to 3d) are formed of the independent epitaxially-grown layers as illustrated in FIG. 1, the high-concentration layer may be formed of a single epitaxially-grown layer. In such a case, the impurity concentration of at least the part (the upper part) of the high-concentration layer in contact with the base regions 8a to 8c only needs to be set to the impurity concentration of the upper regions 3a to 3d described above. In addition, a multi-step ion implantation at a high acceleration rate can be executed after the formation of the high-concentration layer with the single epitaxially-grown layer, so as to form the p$^+$-type lower buried regions 4a to 4e. All of the regions in the high-concentration layer (2a, 2b, and 3a to 3d) may also be formed by the ion implantation method.

The embodiment of the present invention has been illustrated above with the MISFET including the insulated gate structures (12 and 13a), (12 and 13b) in the respective trenches 11a and 11b as illustrated in FIG. 1, but is not limited to this case. The embodiment of the present invention may also be applied to an insulated gate semiconductor device having various kinds of insulated gate structures such as IGBT having a trench provided therein with an insulated gate structure. The trench gate IGBT may have a configuration in which the n$^+$-type source regions 10a to 10d of the MISFET illustrated in FIG. 1 serve as emitter region, and a p$^+$-type collector region is provided as a carrier reception region on the bottom surface of the drift layer 1.

The embodiment of the present invention has been illustrated above with the insulated gate semiconductor device using SiC. The embodiment of the present invention may also be applied to various types of insulated gate semiconductor devices using, other than SiC, a semiconductor (a wide band-gap semiconductor) material having a greater band gap than silicon (Si), such as gallium nitride (GaN), diamond, and aluminum nitride (AlN) having a smaller diffusion coefficient than Si.

What is claimed is:

1. An insulated gate semiconductor device comprising:
a drift layer of a first conductivity-type;
a high-concentration layer of the first conductivity-type, and including:
    a lower region on a top surface of the drift layer, and
    an upper region on a top surface of the lower region and having an impurity concentration lower than an impurity concentration of the lower region;
a buried layer of a second conductivity-type inside the high-concentration layer and including an upper buried region inside the upper region;
an injection regulation region of the second conductivity-type on a top surface of the upper region and a top surface of the upper buried region;
a high-concentration region of the second conductivity-type inside the injection regulation region and having an impurity concentration higher than an impurity concentration of the injection regulation region;
a carrier supply region of the first conductivity-type selectively at an upper part of the injection regulation region;
a plurality of trenches, a trench among the plurality of trenches penetrating the injection regulation region to reach the high-concentration layer; and
an insulated gate structure inside the trench,
wherein
    a ratio of the impurity concentration of the injection regulation region to an impurity concentration of the high-concentration layer at least at a part in the upper region of the high-concentration layer in contact with the injection regulation region is 0.5 or greater and 2 or smaller,
    the high-concentration region has both side surfaces directly in contact with adjacent trenches among the plurality of trenches, and
    the high-concentration region is evenly in a middle in a depth direction of the injection regulation region.

2. The insulated gate semiconductor device of claim 1, wherein the impurity concentration of the high-concentration layer at least at the part in contact with the injection regulation region is $4 \times 10^{16}$ cm$^{-3}$ or greater and $6 \times 10^{16}$ cm$^{-3}$ or less.

3. The insulated gate semiconductor device of claim 1, wherein the impurity concentration of the part is $4 \times 10^{16}$ cm$^{-3}$ or greater and $5 \times 10^{16}$ cm$^{-3}$ or less, and the ratio of the impurity concentration is 0.5 or greater and 1 or smaller.

4. The insulated gate semiconductor device of claim 1, wherein the impurity concentration of the part is $5 \times 10^{16}$ cm$^{-3}$ or greater and $6 \times 10^{16}$ cm$^{-3}$ or less, and the ratio of the impurity concentration is 1.2 or greater and 2 or smaller.

5. The insulated gate semiconductor device of claim 1, wherein the buried layer further includes
    a lower buried region inside the lower region, and
    the upper buried region is at a part of a top surface of the lower buried region and separated from the trench.

6. The insulated gate semiconductor device of claim 5, further comprising a partial current spreading layer of the first conductivity-type at a part of a bottom surface of the lower buried region and having an impurity concentration higher than an impurity concentration of the drift layer.

7. The insulated gate semiconductor device of claim 5, wherein another part of the lower buried region is in contact with a bottom surface of the trench.

8. The insulated gate semiconductor device of claim 5, wherein a depth of a bottom surface of the lower region is greater than a depth of a bottom surface of the lower buried region.

9. The insulated gate semiconductor device of claim 1, wherein the impurity concentration of the high-concentration region is $2 \times 10^{17}$ cm$^{-3}$ or greater and $7 \times 10^{17}$ cm$^{-3}$ or less.

10. The insulated gate semiconductor device of claim 1, wherein a bottom surface of the upper region of the high-concentration layer is in contact with a side wall of the trench.

11. The insulated gate semiconductor device of claim 5, wherein
    the lower buried region includes a plurality of lower buried regions, and
    a bottom surface of each trench of the plurality of trenches is directly in contact with a top surface of a lower buried region of the plurality of lower buried regions.

12. The insulated gate semiconductor device of claim 11, wherein lower buried regions of the plurality of lower buried regions are separated from each other with upper parts of the lower region interposed therebetween.

13. The insulated gate semiconductor device of claim 12, wherein lower buried regions of the plurality of lower buried regions are in a middle position between adjacent trenches of the plurality of trenches.

14. The insulated gate semiconductor device of claim 5, wherein the upper region is on a top surface of the lower buried region.

15. The insulated gate semiconductor device of claim 1, wherein side surfaces of the upper buried region are directly in contact with upper regions.

\* \* \* \* \*